United States Patent
Schmidt et al.

(10) Patent No.: US 6,318,389 B1
(45) Date of Patent: Nov. 20, 2001

(54) APPARATUS FOR CLEANING SEMICONDUCTOR WAFERS

(75) Inventors: Philip R. Schmidt, St. Charles; Jon Seilkop, O'Fallon; Craig Spohr, Kirkwood, all of MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

(21) Appl. No.: 09/430,654

(22) Filed: Oct. 29, 1999

(51) Int. Cl.[7] ........................................... B08B 11/02
(52) U.S. Cl. ........................ 134/201; 118/500; 134/902
(58) Field of Search ................................ 134/902, 182, 134/201; 118/500; 211/41.18; 206/454

(56) References Cited

U.S. PATENT DOCUMENTS

| 4,566,839 | * | 1/1986 | Butler ........................ 118/500 X |
| 4,669,612 | * | 6/1987 | Mortensen ................... 134/902 X |
| 4,993,559 | * | 2/1991 | Cota ............................ 211/41.18 |
| 5,370,142 | * | 12/1994 | Nishi et al. ................... 134/902 X |
| 5,534,074 | * | 7/1996 | Koons ........................ 118/500 X |
| 5,704,493 | | 1/1998 | Fujikawara et al. . |
| 5,817,185 | | 10/1998 | Shindo et al. .................. 134/25.4 |
| 5,853,496 | * | 12/1998 | Honda ........................ 118/500 X |
| 5,862,863 | | 1/1999 | Swisher ......................... 166/313 |
| 5,868,865 | | 2/1999 | Akimoto ........................ 134/33 |
| 5,887,604 | | 3/1999 | Murakami et al. .............. 134/102.2 |

FOREIGN PATENT DOCUMENTS

| 8-203992 | 9/1996 | (JP) . |
| WO97/39475 | 10/1997 | (WO) . |

OTHER PUBLICATIONS

Hostaflon TFM 1700 Product brochure.*
International Search Report dated May 18, 2001 for corresponding application Ser. No. PCT/US00/28117.

* cited by examiner

Primary Examiner—Philip R. Coe
(74) Attorney, Agent, or Firm—Senniger, Powers, Leavitt & Roedel

(57) ABSTRACT

A device for cleaning semiconductor wafers is provided. The device includes a carrier for holding wafers during the cleaning process. The carrier includes a frame with an open top and a plurality of carrier rods extending between opposite ends of the frame. The carrier rods have grooves that receive marginal edge portions of the wafers to retain them against movement in the carrier during cleaning and transportation. The grooves are structured to reduce the amount of contaminants remaining on the wafers after cleaning. The frame may be made substantially entirely of a polymeric material.

7 Claims, 8 Drawing Sheets

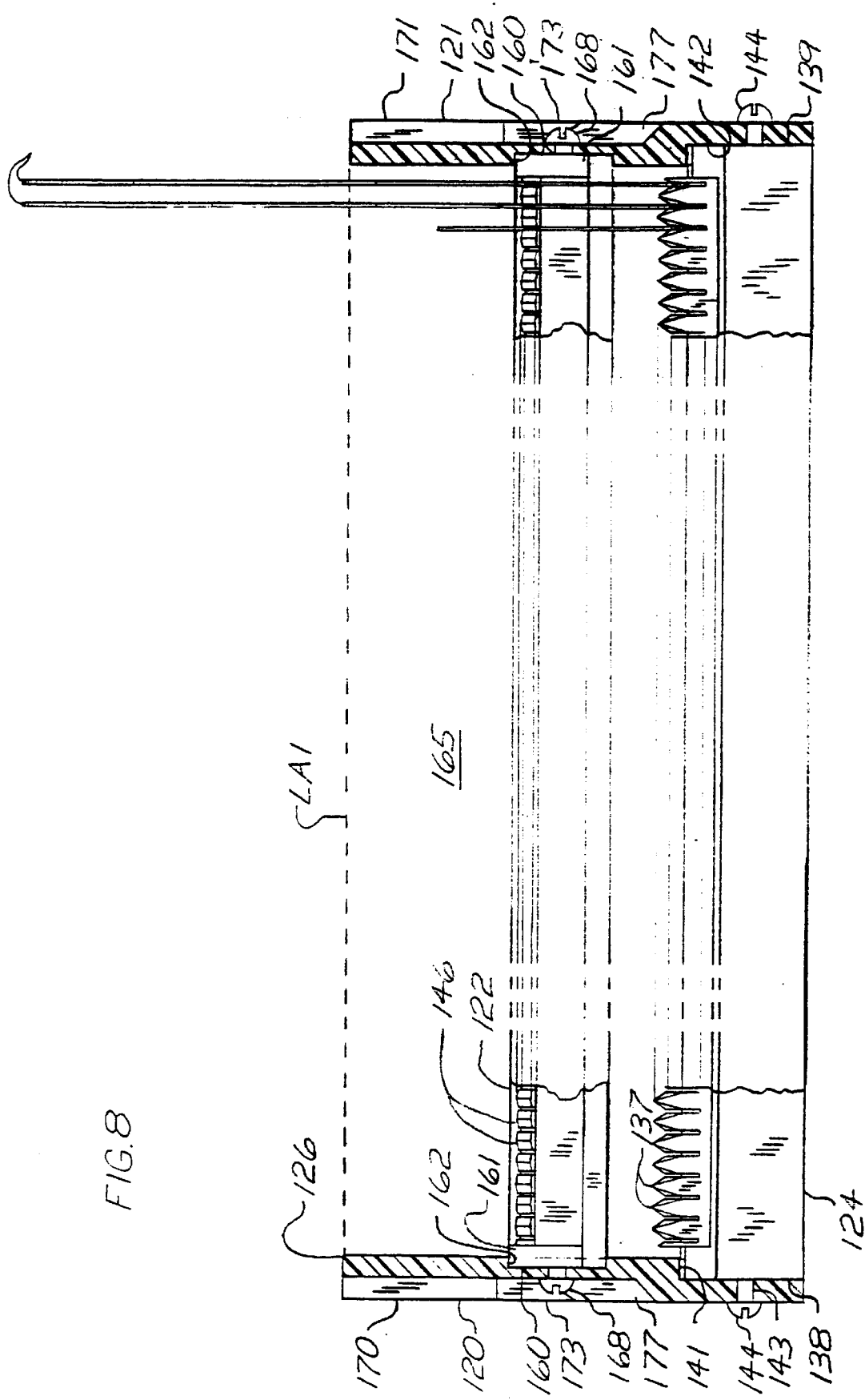

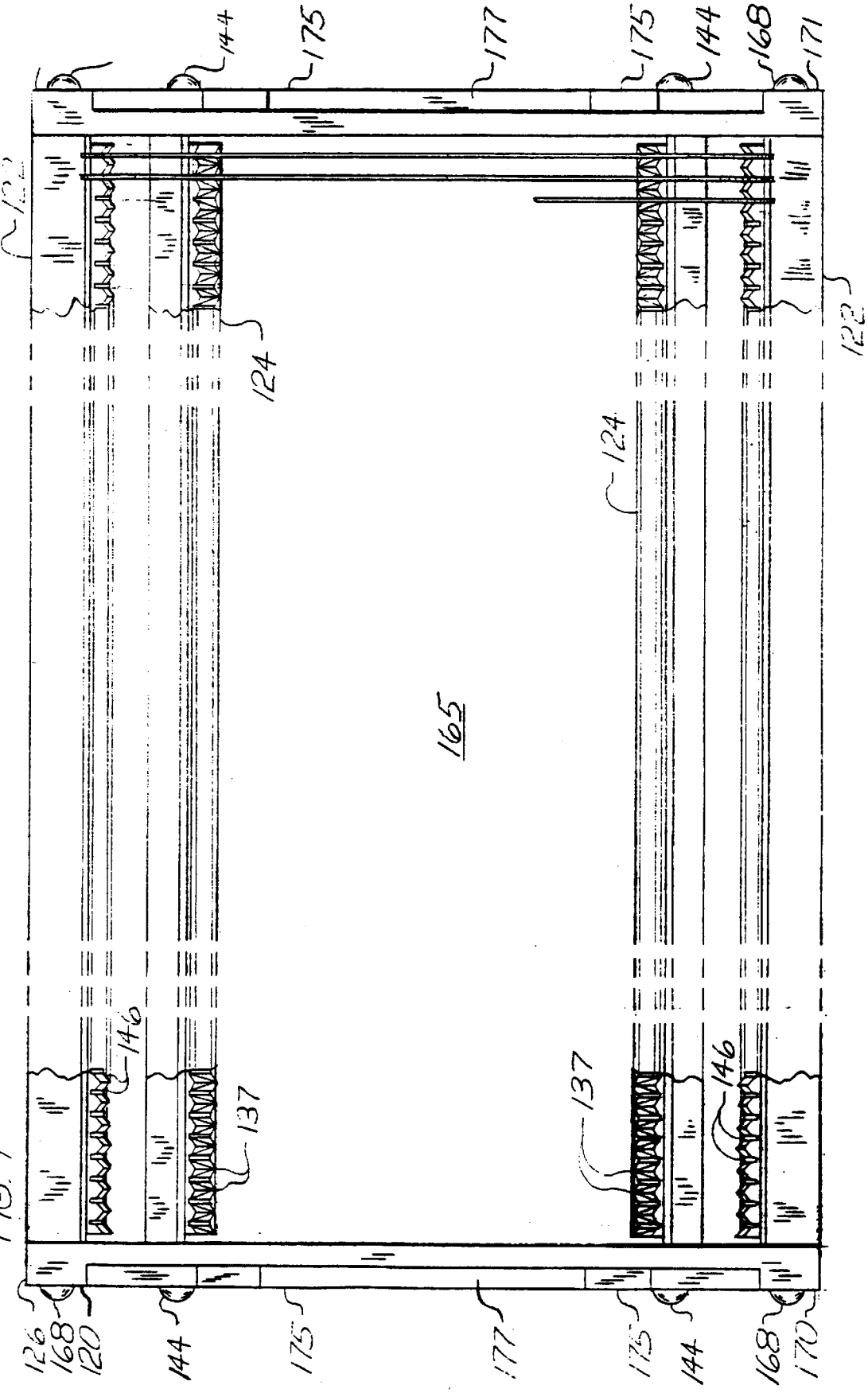

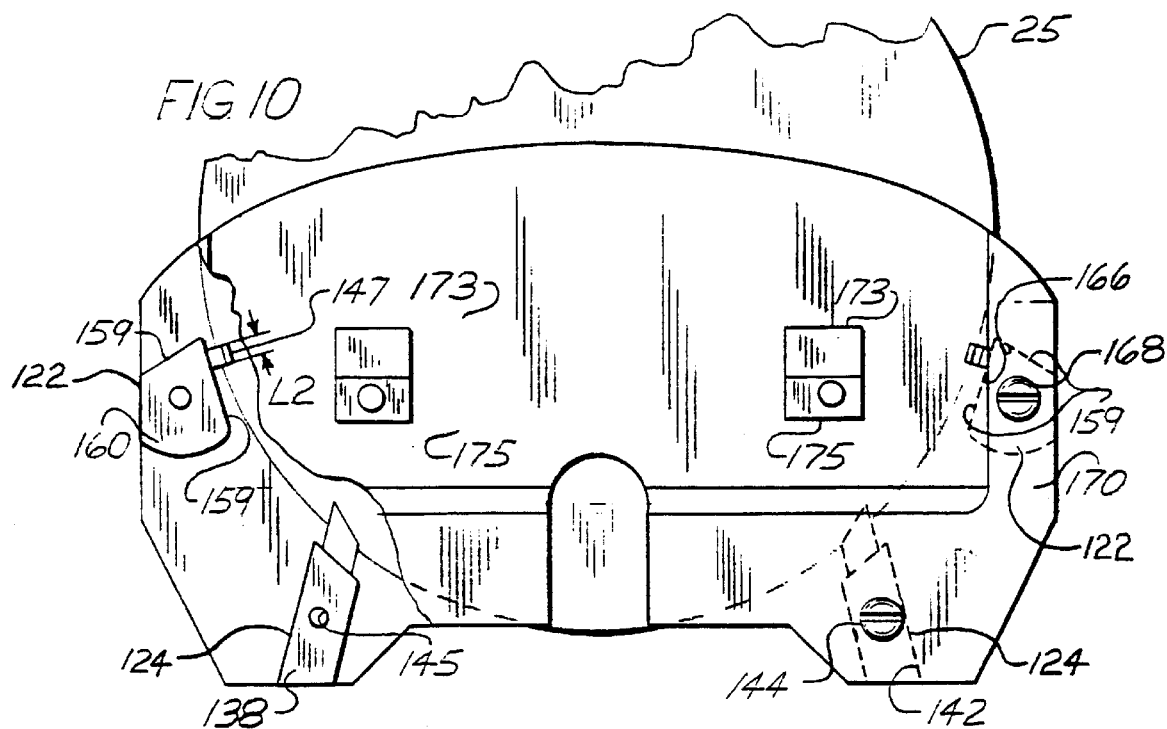
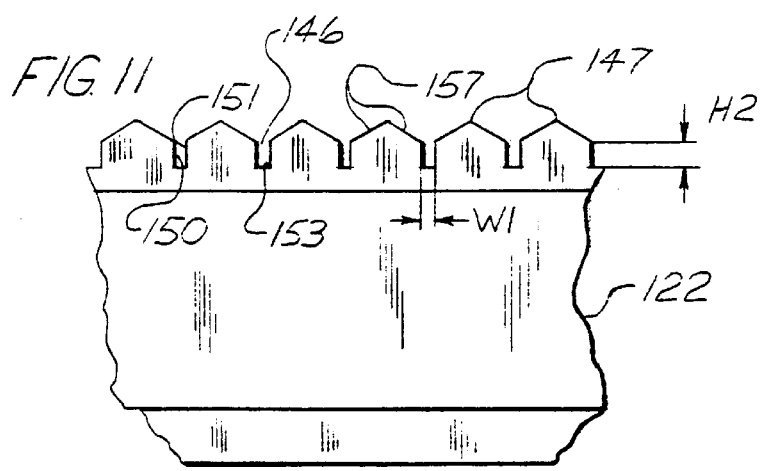

APPARATUS FOR CLEANING SEMICONDUCTOR WAFERS

BACKGROUND OF THE INVENTION

The present invention relates to an apparatus for carrying semiconductor wafers during the wafer cleaning process. During the semiconductor manufacturing process, the surfaces of wafers become contaminated with cutting and polishing residue, organics, metals and cleaning solution residue. Even extremely minor quantities of contaminants can negatively affect the wafer for subsequent handling steps or when it is used as a substrate for an electronic circuit. Many devices are on the market for effecting such cleaning and have been generally effective. However, as wafer specifications have become more stringent, so have the wafer cleaning requirements sometimes resulting in a lower yield rate. Further, price competition in the wafer and electronic device markets has also become more intense making manufacturing efficiencies even more important. Thus, scrap needs to be reduced as much as possible to help improve yield rate and maintain profitability.

A wafer can be cleaned by either or both of a spray wash and an immersion wash. While such devices and methods have been generally effective, more stringent specifications have resulted in a higher reject rate for the wafers and semiconductor devices being made from the wafers. Cleaning typically includes sequential cleaning steps, as are known in the art. Each cleaning phase is generally followed by a rinse step to remove the cleaning solution. In a sense, the rinse step is also a cleaning step whose chief purpose is to remove the cleaning solutions. Generally, the first cleaning step involves the application of a base such as ammonia followed by a water rinse step. After the first rinse step, the wafers are exposed to an acid such as hydrofluoric, fluoric or hydrochloric. If there is any ammonia carried with the wafers to the acid cleaning step, it will react with the acid and produce a salt which is a contaminant to the wafer. The acid treated wafers are rinsed again with water. After this subsequent water rinse, the wafers are exposed to isopropyl alcohol (IPA) in a vapor chamber to assist in removing the rinse water and to dry the wafers. All of the cleaning fluids must be extremely clean so as to not contaminate the wafers. Such cleaning process may be used at more than one point in the wafer manufacturing process.

During cleaning, wafers are carried in a carrier. The wafers are robotically placed in grooves in carrier rods in the cassette. The grooves retain the wafers in position in the cassette while exposing as much of the wafer surfaces as practicable to the cleaning and rinsing fluids. It has been found that the surfaces of the grooves will induce the formation or collection of residue from the cleaning and/or rinsing liquids on the wafers in the area where the faces of the wafer are adjacent the groove surfaces at a marginal edge of the wafer.

The use of grooves has been found to be particularly advantageous for holding wafers in position in the cassette. To robotically load and unload the wafers, the wafers must be accurately positioned which is accomplished by the use of narrow grooves in cassette rods. Thus, to continue to use current robotics and wafer processing equipment, narrow grooves have been preferred for accurately positioning the wafers. The grooves, although effective for use with robots, are believed to be a major contributor to the formation of the aforementioned spotting problem. Spots form on marginal edge portions of wafers where they are closely spaced from or in contact with carrier rod groove surfaces. Even though at one time the spots would have been considered minor defects, they need to be eliminated or reduced to improve the yield rate to maintain acceptable pricing and margins. It would also be desirable to continue to use cassettes with grooved rods because of their effectiveness at wafer retention, support and positioning which are also important to effective and efficient manufacturing.

The spots are a film or residue left when the cleaning and rinsing liquids are removed from wafers. It has been found that the incident rate of spot creation can be reduced by providing better drainage of cleaning and rinse liquids and more IPA in the area between the groove surfaces and the marginal edge portions of the wafer positioned in the carrier. This can be done while still providing the desired degree of wafer position tolerance in the cassette during cleaning.

Current cassettes have frames that are typically made of fused quartz which is expensive and make the cassettes difficult to repair. Fused quartz is desirable because it is resistant to degradation by the cleaning and rinsing fluids. Many times the cassettes will use grooved carrier rods made of a polymer that is resistant to degradation by the cleaning fluids. However, polymers acceptable from a degradation standpoint have tended to be soft and not resistant to wear caused by contact with the wafers. In order to obtain acceptable life from a wear standpoint, the area that contacts the wafers was made large, making the spotting worse. Carrier rods are also lacking in structural rigidity because of the properties of the polymer and need to be reinforced to support loads. A typical carrier rod is hollow polytetrafluoroethylene with, e.g., a graphite composite rod sealed inside for structural support. However, after some use, such carrier rods tend to leak cleaning fluid which attacks the reinforcing rod and contaminate the wafers being cleaned.

Thus, there is a need for an improved cassette and carrier rod. The present invention provides an improved cassette and carrier rod that will improve cleaning efficiency and thereby improve the wafer production yield rate while maintaining accurate positioning of the wafers so they can be handled robotically.

SUMMARY OF THE INVENTION

Among the several objects and features of the present invention may be noted the provision of an apparatus for carrying semiconductor wafers during cleaning that will improve cleaning efficiency; the provision of such an apparatus that will accurately for robotic loading and unloading; the provision of such an apparatus that is simple in construction requiring few parts; the provision of such an apparatus that is adapted to be used in various types of cleaning apparatus; the provision of such an apparatus that can have components subject to wear replaced; the provision of such an apparatus that has a long life; the provision of such an apparatus that is economical to manufacture; the provision of such an apparatus that can be easily loaded with a plurality of semiconductors and safely transport them to and thru the cleaning apparatus; the provision of such an apparatus that can be used in both immersion and spray type washers; the provision of such an apparatus that does not require major changes to the currently used cleaning and robotic devices; and the provision of such an apparatus that can be substantially entirely made of polymeric material.

The present invention involves an apparatus for holding a plurality of semiconductor wafers during cleaning. The apparatus includes a frame with a bottom, an open top and a longitudinal axis. A pair of carrier rods is secured to and extends between opposite ends of the frame and are in spaced apart relation and positioned on opposite sides of the longitudinal axis and between the longitudinal axis and the frame bottom. Each carrier rod has a plurality of transverse grooves in spaced apart relation along the length of the carrier rod and opening into the interior of the frame. Each groove in one carrier rod is substantially transversely aligned with a respective groove in the other carrier rod and is adapted to receive a semiconductor wafer therein for support in a generally vertical orientation. The grooves have an open top, a bottom surface and generally opposite side surfaces each facing a respective opposite side of a wafer. The grooves retain the wafer in the generally vertical orientation. The carrier rods are transversely spaced a distance less than the diameter of the wafer. The groove side surfaces are spaced apart a distance greater than the thickness of the wafer and each groove side surface has a channel recessed therein opening into the groove. Each channel is positioned between the bottom surface and the open top of the groove forming an enlarged gap for flow of liquid out of the grooves and away from the wafers.

The present invention also involves the provision of an apparatus for holding a plurality of wafers during cleaning. The apparatus includes a frame made substantially entirely of polymeric material. The frame has an open top and frame end members connected in spaced apart relation defining an interior for containing a plurality of wafers. The frame also includes a plurality of elongate wafer support members extending between and secured to the end members. The support members are adapted to support and retain a plurality of wafers in spaced apart generally parallel relationship.

In a further aspect of the present invention, an apparatus is provided for holding a plurality of a semiconductor wafers during cleaning. The apparatus includes a frame with a bottom and an open top and a longitudinal axis. The frame includes a pair of first carrier rods secured to and extend between opposite ends of the frame. The first carrier rods are in spaced apart relation and positioned on opposite sides of the longitudinal axis of the frame and between the longitudinal axis and the frame bottom. Each first carrier rod has a plurality of transverse grooves in spaced apart relation along the length of the first carrier rod and opens into the interior of the frame. Each groove in one first carrier rod is substantially transversely aligned with a respective groove in the other said first carrier rod and adapted to receive a semiconductor wafer therein for support in a generally vertical orientation. The grooves have an open top, a bottom surface and generally opposite side surfaces each facing a respective opposite side of a wafer and retaining the wafer in the generally vertical orientation. The first carrier rods are transversely spaced a distance less than the diameter of the wafer. The grooves have a height in the range of about 1 mm thru about 3 mm.

Other objects and features will be in part apparent and in part pointed out hereinafter.

BRIEF DESCRIPTION OF THE DRAWINGS

FIG. 8 is a side elevation view of a modified wafer carrier;

FIG. 9 is a plan view of the wafer carrier of FIG. 8;

FIG. 10 is an end view of the wafer carrier of FIG. 8 with portions broken away to show details therein; and FIG. 11 is an enlarged fragmentary view of a portion of the carrier rod showing details of the wafer grooves.

Corresponding reference characters indicate corresponding parts throughout the several views of the drawings.

DETAILED DESCRIPTION

Figure 1:
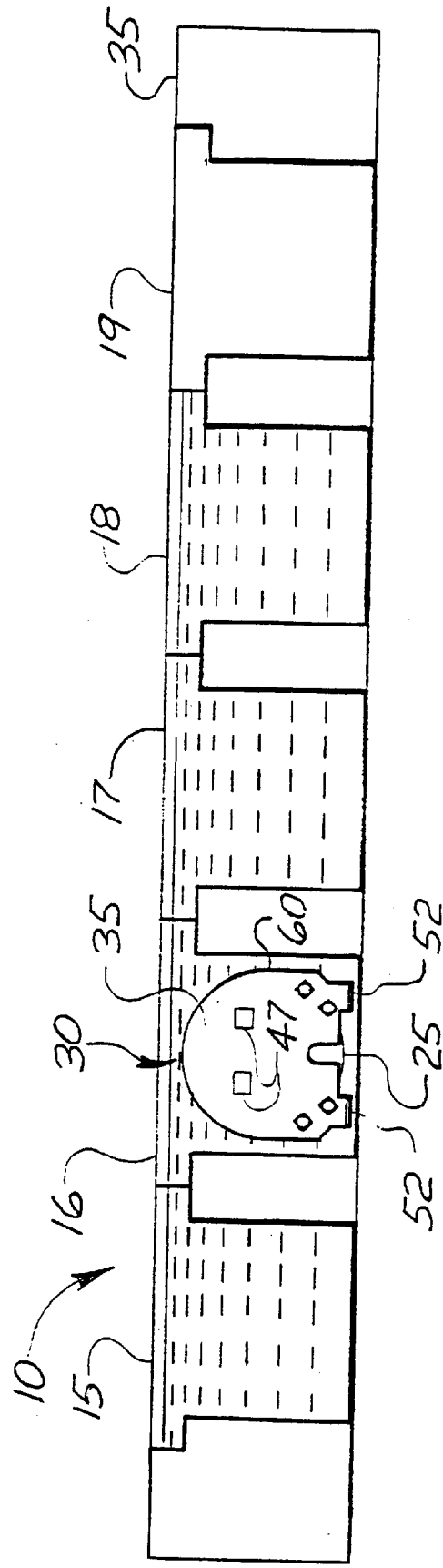
FIG. 1 is a schematic illustration of a wafer cleaning apparatus.
Figure 2:
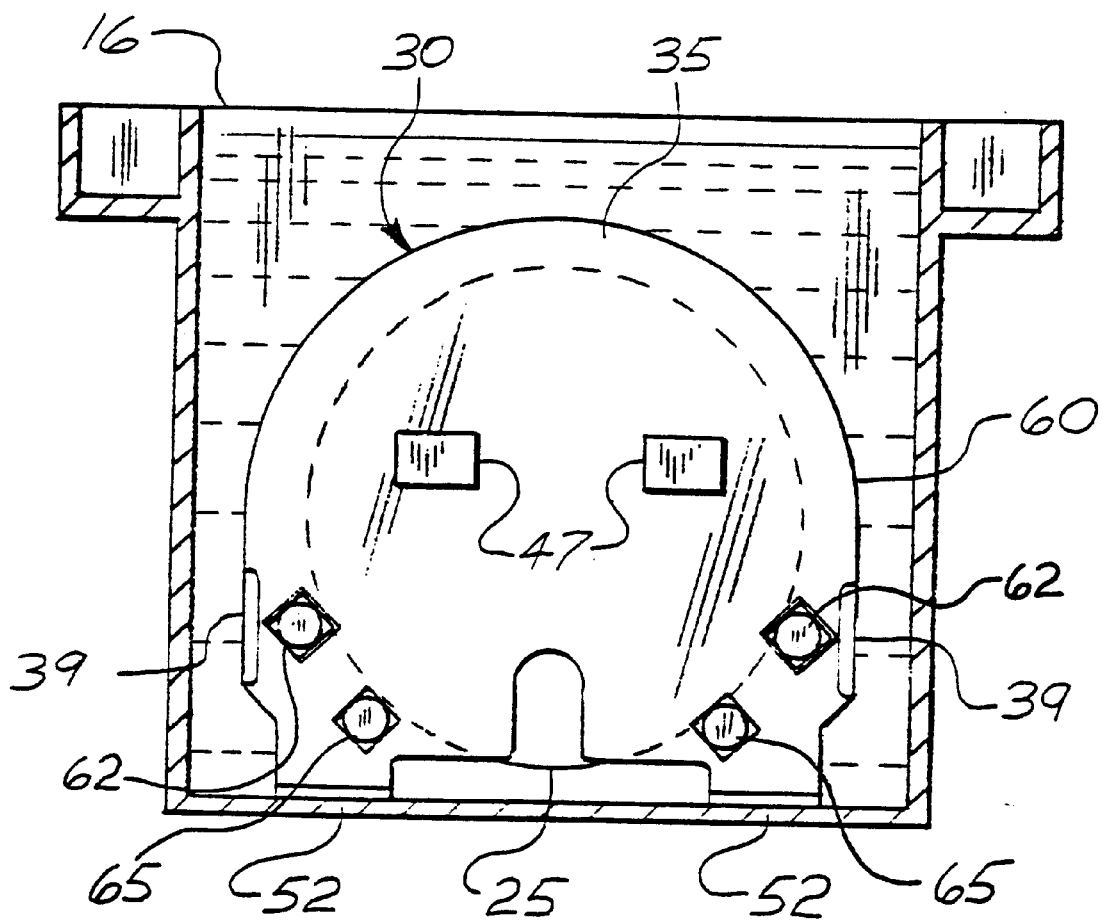
FIG. 2 is a schematic illustration of a wafer carrier in a tank used to hold a cleaning process liquid.

The reference numeral 10 designates generally an apparatus for cleaning semiconductor wafers. One type of semiconductor wafer is a crystalline silicon wafer. The cleaning described herein takes place typically after the wafer is finally polished as is known in the art, and in addition, can be used at more than one point in the wafer manufacturing process to provide multiple cleanings.

The apparatus 10, a wafer cleaning bench, uses a series of tanks, for example, tanks 15, 16, 17, 18, 19 (FIG. 1) for holding various cleaning and rinsing fluids preferably liquids in the tanks 15–18 and also vapor in the tank 19. In a typical process, the wafers 25 are carried or transported to the apparatus 10 in a carrier 30 and sequentially placed in the tanks 15–19 for exposure to or application of the various fluids.

The tanks 15–19 are mounted in a housing 35 and are made of material that is inert to the chemicals contained therein. Such materials include quartz. Various feeds and outlets (not shown) are provided to convey the various cleaning and rinsing fluids to and from the tanks 15–19. Robots (not shown), as are known in the art, can also be provided for moving the carrier 30 and wafers 25 therein to the various tanks 15–19. Robots, not shown, are also used to load and unload the wafers 25 into and from the carrier 30 as is known in the art.

Figure 3:
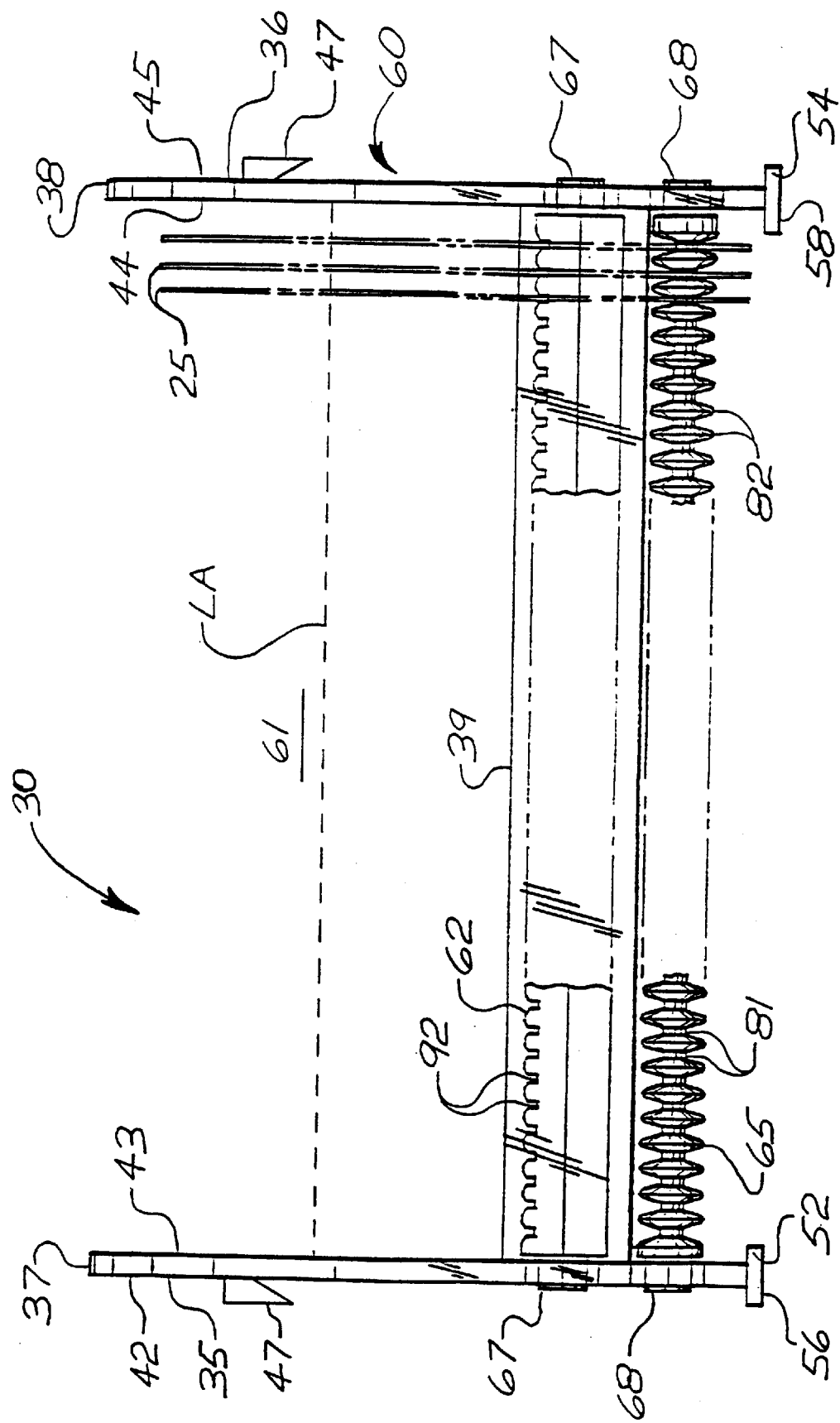
FIG. 3 is a side elevation view of a wafer carrier containing wafers.
Figure 4:
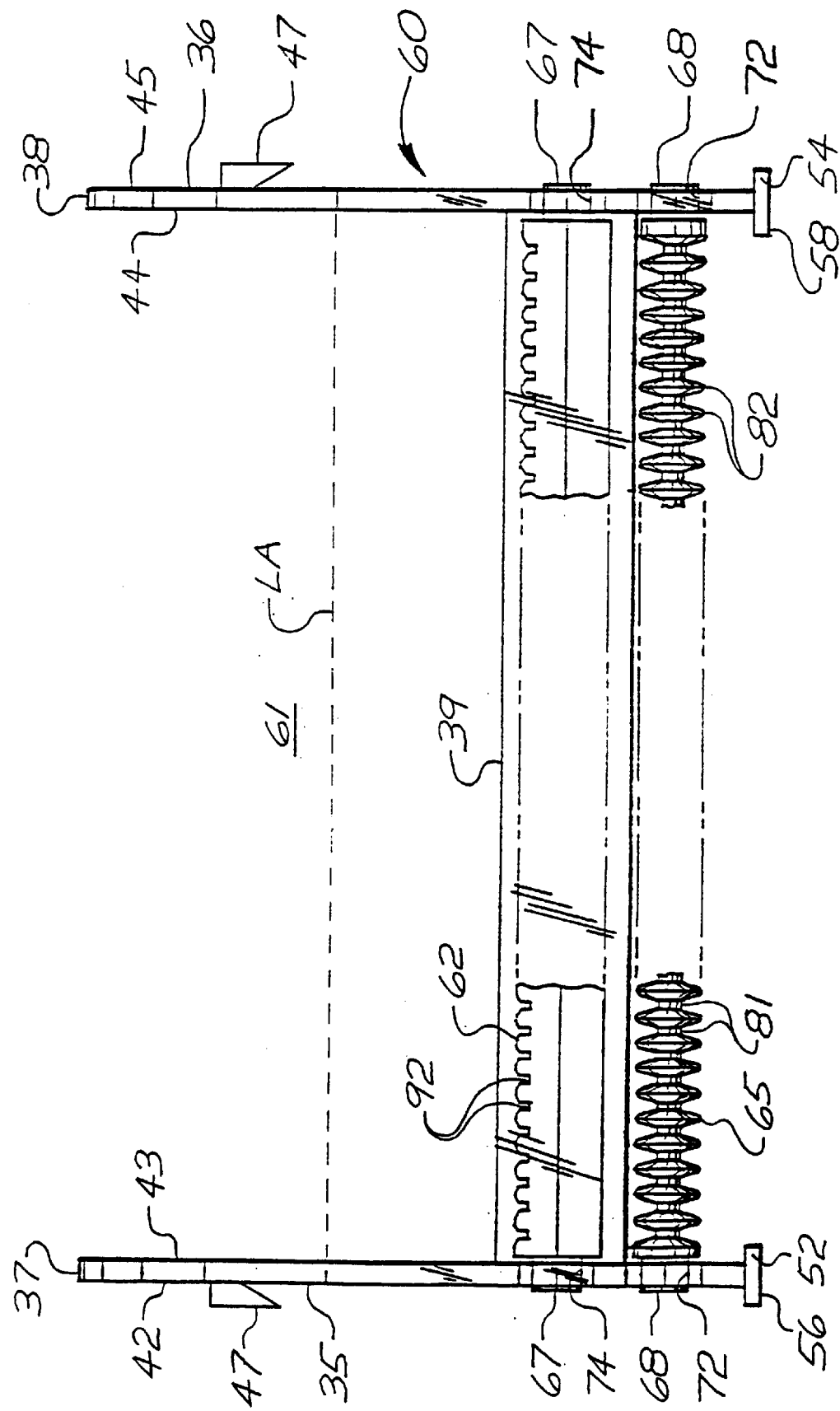
FIG. 4 is a side elevation view of a wafer carrier without wafers.
Figure 5:
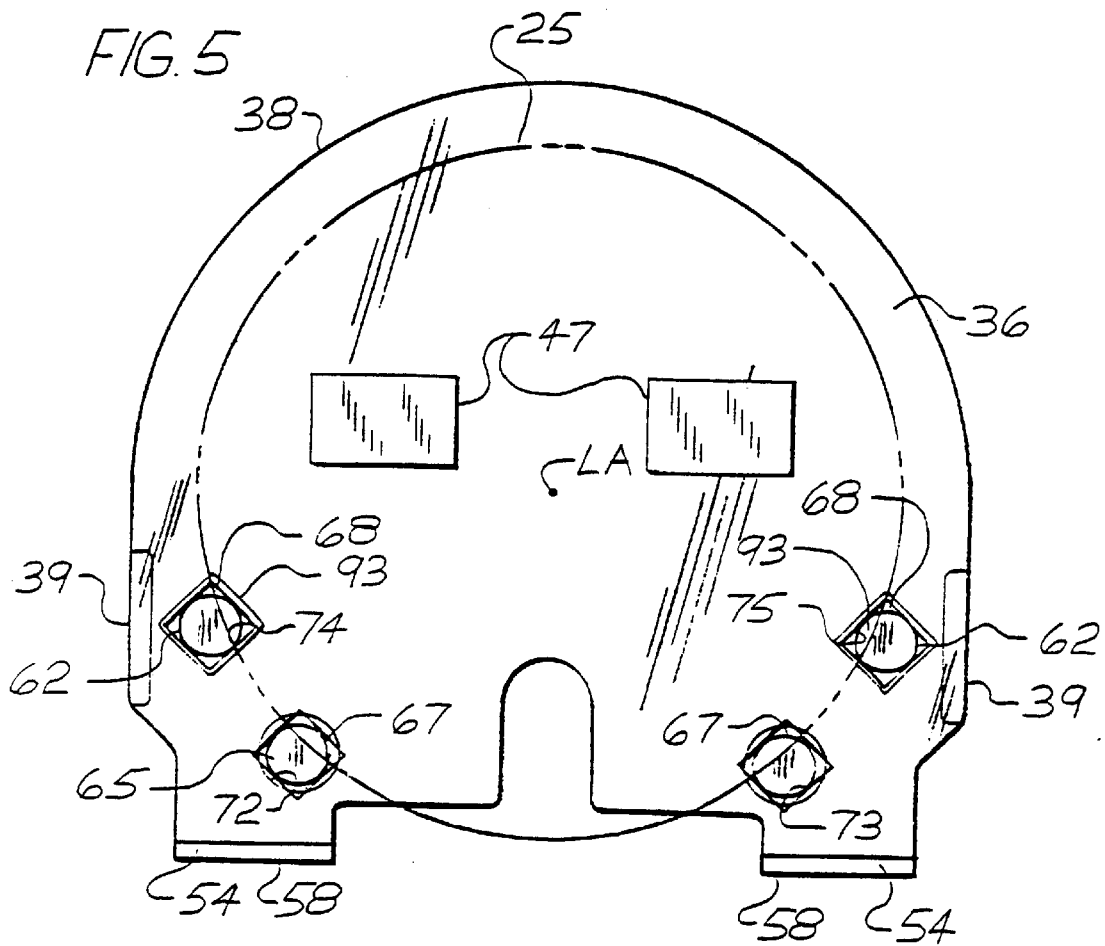
FIG. 5 is an end view of a wafer carrier.

The carrier 30 is best seen in FIGS. 3, 4, and 5. The carrier 30 comprises two end walls 35, 36 that are generally parallel, and in use, are generally vertically disposed. The end walls 35, 36 each have a peripheral edge 37, 38 respectively and oppositely facing main surfaces 42, 43 and 44, 45 respectively. Hitches 47 are affixed to the end walls 35, 36 for engagement with the robot to allow the robot to pick up and move the carrier. Preferably, each end wall 35, 36 has a pair of feet 52, 54 respectively. The feet 52, 54 extend laterally from the respective peripheral edge 37, 38 and each has a bottom surface 56 and 58 respectively. The bottom surfaces 56, 58 define a plane and the carrier 30 rests on the bottom surfaces. The end walls 35, 36 are secured together in spaced apart relation with a plurality of tie bars 39. Securement can be by any suitable means but needs to be resistant to deterioration by the cleaning and rinsing liquids used. The tie bars 39 are secured to the surfaces 43, 44 and are generally perpendicular thereto. The tie bars 38 and end walls 35, 36 form an open top frame 60 with an interior 61. The frame 60 is adapted to support additional wafer support components. The carrier 30 has a longitudinal axis LA which for purposes of the description herein, is considered to be located at the approximate center of the wafers 25 when in position in the carrier 30. The tie bars 39 are preferably positioned below the longitudinal axis LA. The end walls 35, 36 and the tie bars 39 are made of a material resistant to deterioration by the cleaning and rinsing fluids and in one form of the invention can be fused quartz. If the end walls 35, 36 and tie bars 38 are fused quartz, one means of securement is fusing the tie bars to the end walls.

The carrier 30 also includes a plurality of carriers rods, which as shown, include a pair of upper carrier rods 62 and a pair of lower carriers rods 65. The rods 62, 65 are suitably mounted on the frame 60 preferably by mounting on and extending between the end walls 35, 36. The carrier rods 62, 65 have round end portions 67, 68 respectively. As shown, the end walls 35, 36 each have a plurality of apertures 72, 73, 74, 75. Preferably the apertures 72–75 are generally rectangular in shape and have a spacing between the edges defining the apertures slightly larger than the diameters of the respective round ends 67, 68. The round ends 67, 68 are each received in a respective aperture 72–75 and thereby mount the carrier rods 62, 65 on the end walls 35, 36 and hence the frame 60. By having round ends 67, 68, the carrier rods 62, 65 can rotate about their longitudinal axes. Preferably, the carrier rods 62, 65 are mounted at positions below the longitudinal axis, i.e., between the longitudinal axis and the plane of the feet 52–55. If one considers a point vertically above the longitudinal axis, when the feet 52, 54 are on a horizontal plane, as 0° (a 12 o'clock position), one carrier rod 62 is positioned between about 90° and about 135°, the other carrier rod 62 is positioned between about 225° and about 270°, one carrier rod 65 is positioned between about 120° and about 170° and the other carrier rod 65 is positioned between about 190° and about 240°. Thus, one carrier rod 62 and one carrier rod 65 are one side of a vertical plane thru the longitudinal axis and the other carrier rod 62 and the other carrier rod 65 are positioned on the other side of the vertical plane thru the longitudinal axis.

The lower carrier rods 65 are elongate and have a plurality of wafer receiving or retaining grooves 81 spaced along the length thereof and have a spacing (pitch) therebetween (FIGS. 3, 4). A preferred transverse shape of the grooves 81 is shown in FIGS. 3, 4 and provides for minimal contact with the wafer 25 as is practicable with the need for reliable positioning in the grooves 81. The preferred shape is generally V-shaped. The grooves 81 are formed by annular rings 82 that project radially from the carrier rods 65 and extend generally transversely around the periphery of the carrier rods 65. The grooves 81 in one carrier rod 65 are generally transversely aligned with the grooves 81 in the other carrier rod 65 so that the wafers 25 extend generally transversely across the carrier 30. The grooves 81 open at least into the interior 61 and are preferably annular extending around the entirety of the respective rod 65.

The upper carrier rods 62 each have a plurality of generally transverse grooves 92 in an outer surface 93. The grooves 92 are in spaced apart relation along the length of the carrier rod 62. The pitch of the grooves 92 is substantially equal to the pitch of the grooves 81. Also the grooves 92 are generally vertically or transversely aligned relative to the longitudinal axis LA and with respective grooves 81. The grooves 92 in one carrier rod 62 at least open generally into the interior 61 and face or open generally toward a respective groove 92 in the other carrier rod 62. Two grooves 92 and two grooves 81 form a socket for the receipt of a wafer 25 to hold it in a generally vertical orientation and transverse to the longitudinal axis LA. The carrier rods 62 are generally circular in transverse cross section and can rotate in the apertures 74, 75 to position the carrier rods in various rotational positions and the grooves 92 are annular, extending around the periphery of the respective carrier rod 62. This will help place the grooves 92 in the correct orientation for receipt of the wafers 25 therein.

Figure 6:
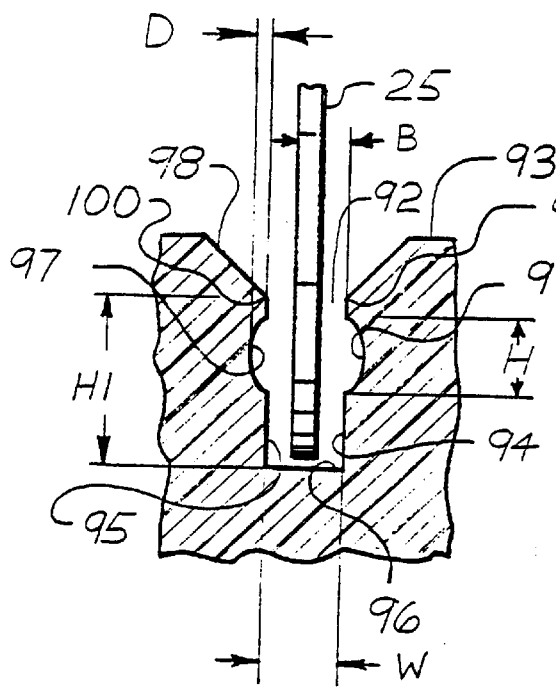
FIG. 6 is an enlarged fragmentary view of a wafer in a groove of a carrier rod.
Figure 7:
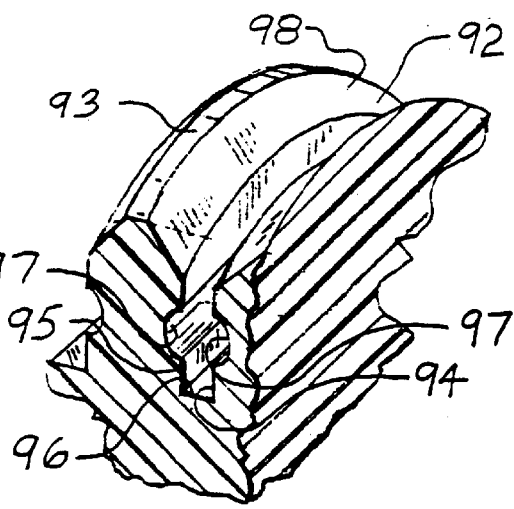
FIG. 7 is an enlarged fragmentary perspective view of a wafer retention groove in a carrier rod.

The grooves 92 are defined by two generally parallel side surfaces 94, 95 and a bottom surface 96 (FIGS. 6, 7). The side surfaces 94, 95 can diverge slightly, while still being generally parallel, from one another or tapered from the bottom surface 96 at an angle B for each surface from a groove center line up to about 5° for a total divergence angle of twice that. The grooves 92 each have a width W in the range of about 1 mm thru about 1.75 mm and preferably in the range of about 1 thru about 1.5 mm. The groove width is in the range of about 0.4 mm thru about 1.1 mm and preferably 0.5 mm thru about 0.8 mm larger than the thickness of the wafer 25 providing space between at least one side surface 94, 95 and the wafer 25. To hold the wafer 25 steady and in position, the grooves 92 need to be narrow but still wide enough for easy insertion of a wafer 25. Because this spacing is small, it is difficult to drain or remove the cleaning and rinsing liquids from between the wafer 25 and the surfaces 94, 95. Also, some capillary action can occur in narrow gaps making liquid extraction or drainage difficult. A tapered lead-in area 98 opens from each groove 92 to facilitate insertion of the wafers 25 into the grooves.

Channels 97 are provided for improved circulation of the liquid(s) in the grooves 92 and around the wafer 25 (FIGS. 6, 7). Further, it has been found that the provision of a channel 97 in each of the surfaces 94, 95 that the liquid(s) can be more effectively removed or drained away from the wafers 25. Also, the channels 97 improve a subsequently applied liquid removing the prior applied liquid, e.g., a rinse liquid removing a cleaning liquid and a cleaning liquid removing a prior used rinse liquid improving both cleaning and rinsing. The channels 97 preferably have both ends thereof open to the exterior of the grooves 92 and the carrier rod 62. The channels 97 are positioned generally centrally between the bottom surface 96 and apexes 99, 100 of the surfaces 94, 95 respectively. The channels 97 preferably have a height H that is in the range of about 25% thru about 75% of the height H1 of the groove 92 at its apex, i. e., the groove's maximum height. H1 is in the range of about 1 mm thru about 3 mm and preferably in the range of about 1.75 mm thru about 2.25 mm. The channels 97 are generally semicircular in transverse cross section and have a maximum depth D in the range of about 1.5 mm thru about 2.5 mm and preferably about 2 mm thru about 2.5 mm. The channels 97 provide an enlarged width to a portion of the grooves 92 and an enlarged flow path for liquids improving their flow into and out of the grooves 92. In a preferred form of the invention, as best seen in FIG. 7, the channels 97 extend generally perpendicular to a radial line from the longitudinal axis of the carrier 30 to the lengthwise midpoint of a respective channel 97. Thus, the channels 97 extend in a direction generally parallel to a tangent to the edges of the wafers 25 at their midpoints in the grooves 92.

The carrier rods 62, 65 are preferably made from a polymeric material such as polytetrafluoroethylene (PTFE). In a preferred embodiment, the polymeric material has hardness in excess of about 60 based on the Shore D scale (DIN 53 505) and a modulus of elasticity (in tension) in excess of about 575 N/mm$^2$ and preferably greater than about 600 N/mm$^2$ (DIN 53 457). A preferred PTFE is Hostaflon TFM 1700.

A 70 percent improvement in spot reduction was achieved using carrier rods having the channels 97 than with similar carrier rods without channels 97.

The process of cleaning wafers 25 will now be generally described. Wafers 25 are placed in the carrier 30 robotically such as with a Fortrend robot. The wafers 25 are placed in the grooves 81, 92 of the carrier rods 65, 62 respectively. The carrier 30 is then sequentially moved from one of the tanks 15–19 to the next tank for the various cleaning and rinsing steps. The tank 15 contains a base such as ammonia and after application of the base to the wafers 25 for cleaning, the carrier 30 and wafers 25 which are then moved to the tank 16 that contains a rinse liquid like water. The rinse liquid is applied to remove the remaining base cleaning liquid. After rinsing, the carrier 30 and wafers 25 are then drained of the rinse liquid. The carrier 30 and wafers 25 are then moved to the tank 17 for exposure to an acid. Acid is applied to the wafers 25 for further cleaning. The carrier 30 and wafers 25 are then moved to the tank 18. The carrier 30 and wafers 25 are then exposed again to a rinse liquid. The rinse liquid, such as water, is applied to the wafers 25 and carrier 30 in the tank 18. The thus rinsed wafers 25 and carrier 30, after draining, are exposed to heated solvent vapor, such as isopropyl alcohol (IPA), in the tank 19 for removal of the rinse water and are exposed to heat to assist in drying the wafers. The vapor is also dried for removal from the wafers 25. It is to be understood that the liquids can be applied by immersion as described above and can also be applied by spraying or a combination of immersion and spraying. The thus cleaned wafers 25 are removed from the carrier 30 robotically, as with a Fortrend robot, and sent for manufacture of semiconductor devices. The various cleaning and rinsing liquids flow through the channels 97 to improve contact with the wafers 25 in the grooves 92 and removal of the prior used liquids. The cleaning process removes substantially all of the cleaning and rinsing liquids as well as the contaminants.

FIGS. 8–11 illustrate a modified version of a wafer carrier. The modified carrier 105 has end walls 120, 121. Upper and lower carrier rods 122, 124 respectively extend between and are secured to the end walls 120, 121 to form an open top, open bottom frame 126 similar to the frame 60. The end walls have feet 127, 128 similar to the feet 52, 54 for the carrier 105 to rest on. It is preferred that the frame 126, including the carrier rods 122, 124 and end walls 120, 121, be made of polymeric or plastic material such as PTFE that is resistant to degradation by the cleaning and rinse fluids and wear from contact with the wafers 25 as described above. The various parts of the frame 126 can be molded in final form, machined or partially molded and then machined to final form.

Lower carrier rods 124, FIGS. 8, 9, have grooves 137 similar to the grooves 81 in shape, generally V-shaped transversely. The transverse shape of the carrier rods 124 is generally rectangular (FIG. 10) and the grooves 137 are on one side of each of the rods. The rods 124 have opposite ends 138, 139 that are suitably secured to the walls 120, 121 respectively. In a preferred embodiment, the ends 138, 139 are received in similarly sized and shaped sockets 141, 142 respectively. Preferably the ends 138, 139 and sockets 141, 142 are generally rectangular to prevent rotation of the rods 124. Mechanical fasteners 144 extend through apertures 143 in the walls 120, 121 and into threaded bores 145 in the ends of the rods 135 and when tightened, removably secure the rods to the walls 120, 121.

A pair of upper carrier rods 122 is mounted on the frame 126 and are similar to the carrier rods 63 in wafer support and retention function. The transverse shape of the rods 122 is preferably generally rectangular. The rods 122 have a plurality of grooves 146 in spaced apart relation along the length of the rod 122. The spacing or pitch of the grooves 146 and 137 are substantially the same. Each of the grooves 146 in one rod 122 are aligned transversely with a respective groove 146 in the other rod 122 and each of the these pairs of aligned grooves 146 are in transverse alignment with a respective pair of transversely aligned grooves 137 in the rods 124 forming sockets for receiving wafers 25 therein.

The grooves 146 in each rod 122 are formed by a plurality of teeth 147 projecting from one side of the rod. The grooves 146 are defined by a pair of generally parallel side walls 150, 151 and a bottom surface 153. A tapered lead in section 157 opens from each groove 146 to facilitate insertion of the wafers 25 into the grooves 146. It is preferred that the width W1 (FIG. 11) of the grooves 146 be in the range of about 1 mm thru about 1.75 mm and preferably in the range of about 1 mm thru about 1.5 mm. The groove width is in the range of about 0.4 mm thru about 1.1 mm and preferably 0.5 mm thru about 0.8 mm larger than the thickness of the wafer 25 to be retained therein. Wafers 25 are typically on the order of about 0.50 mm thru about 0.80 mm thick. The grooves have a height H2 (FIG. 11) in the range of about 1 mm thru about 3 mm and preferably in the range of about 1.75 mm thru about 2.25 mm and a length L2 (FIG. 10) in the range of about 2 mm thru about 6 mm and preferably in the range of about 3.5 mm thru about 6.5 mm.

The carrier rods 122 are suitably mounted on the end walls 120, 121. As best seen in FIG. 10, a carrier rod 122 has at least one flat surface 159 adjacent each of the opposite ends 160 forming a shank 161. Each of the end walls 120, 121 has a plurality of sockets 162 recessed in the surfaces 163 facing one another and opening into the interior 165 of the carrier 105. The sockets 162 each have a flat surface 166. The sockets 162 and the shanks 161 are similarly sized and shaped and the shanks 161 are each received in a respective socket 162. The carrier rods 122 are prevented from rotation in the sockets 162 by the interengagement of the flats 159, 166. The rods 122 are releasably secured to the end walls and retained in the sockets 162 preferably by mechanical fasteners 168 that extend through apertures (not shown) through the walls and are threadably engaged in threaded bores (not shown) extending longitudinally into the ends 160. The fasteners 168 removably secure the rods 122 to the end walls 120, 121. Tie bars, such as those described above, are not required for the carrier 105 because the rods 122, 124 function as tie bars. It is preferred that the fasteners 144, 168 be made from the above described polymeric material. The carrier 105 is thus of a knock down type. It is contemplated that the carrier 105 could be an integral structure that, e.g., could be made by molding the carrier or by fusing the component parts of the carrier together.

The rods 122, 124 are preferably of generally uniform or homogeneous construction, i.e., they do not use the customary supplemental reinforcing rod therein to provide the required rigidity. The rods 122, 124 are thus substantially entirely made of the polymeric material and are characterized by an absence of a supplemental reinforcing member. By using polymeric material, as described above, resistance to degradation and wear and the required strength can be provided while eliminating a source of contamination. This reduces contamination potential while providing a reduced cost carrier that can easily be repaired particularly by replacing the rods 122 which have the higher wear areas in the grooves 146.

In the carrier 105, it is preferred that the rods 122, 124 be located with one rod 122 and one rod 124 on one side of the longitudinal axis LA1 and the other rods 122, 124 on the other side of the longitudinal axis. In the preferred embodiment, one rod 122 is located between about 90° and about 135°, the other rod 122 is located between about 225° and about 270°, one rod 124 is located between about 120° and about 170° and the other rod is located between about 190° and about 240° relative to 0° as described above.

The carrier 105 is adapted to be moved robotically. In that regard, means is provided for the robot (not shown) to engage for releasable attachment to the carrier 105 to enable the robot to lift and move the carrier. As seen in FIGS. 8, 10, the end walls 120, 121 have exterior surfaces 170, 171 respectively which face in opposite directions and out of the interior 165. At least one hitch 173 is provided for each end wall 120, 121. It is preferred that each hitch 173 be located below the center of gravity of the carrier 105 when loaded with wafers 25. It is also preferred that the hitch 173 on at least one end wall 120, 121 be structured such that it will be in engagement with the robot pick up arm on both sides of the center of gravity of the loaded carrier to prevent rotation of the carrier when lifted. In the illustrated embodiment, the hitches 173 extend outward from the surfaces 164, 165 and are the same on both ends of the carrier 105 so either end may be picked up by either robot arm, i.e. the carrier is symmetrical for the purpose of robotic pick up. As seen in FIG. 10, the hitches 173 each include a pair of hooks 175 secured to each of the end walls 120, 121 and extend from the surfaces 164, 165. One hook 175 on each end wall 120, 121 is positioned on one side of the center of gravity and the other hook of the pair of hooks is positioned on the other side of the center of gravity. For convenience of robot operation, a recess 177 is provided adjacent each hitch 175. The recesses 177 provide clearance for the robot arm. Although the hitches 175 are illustrated as comprising hooks, other hitches could be used. For example, a single hitch that extends laterally from both sides of the center of gravity could be used. It is also to be understood that the hitches 173 could also be positioned above the center of gravity.

When introducing elements of the present invention or the preferred embodiment(s) thereof, the articles "a," "an," "the," and "said" are intended to mean that there are one or more of the elements. The terms "comprising," "including," and "having" are intended to be inclusive and mean that there may be additional elements other than the listed elements.

As various changes could be made in the above constructions without departing from the scope of the invention, it is intended that all matter contained in the above description or shown in the accompanying drawings shall be interpreted as illustrative and not in a limiting sense.

What is claimed is:

1. An apparatus for holding a plurality of semiconductor wafers during cleaning, said apparatus including:

a frame with a bottom and an open top and having a longitudinal axis, said frame including a pair of first carrier rods secured to and extending between opposite ends of the frame, said first carrier rods being in spaced apart relation and positioned on opposite sides of the longitudinal axis of the frame and between the longitudinal axis and the frame bottom, each said first carrier rod having a plurality of transverse grooves in spaced apart relation along the length of the first carrier rod and opening into the interior of the frame, each groove in one first carrier rod being substantially transversely aligned with a respective groove in the other said first carrier rod and adapted to receive a semiconductor wafer therein for support in a generally vertical orientation, the grooves having an open top, a bottom surface and generally opposite side surfaces each facing a respective opposite side of a wafer and retaining the wafer in the generally vertical orientation, said first carrier rods being transversely spaced a distance less than the diameter of the wafer, the groove side surfaces being spaced apart a distance greater than the thickness of the wafer, each said groove side surface having a channel recessed therein opening into the groove and positioned between the bottom surface and the open top of the groove forming an enlarged flow passage for flow of liquid out of the grooves and away from the wafers.

2. An apparatus as set forth in claim 1 wherein the channels have opposite ends opening exteriorly of the groove.

3. An apparatus as set forth in claim 2 wherein the channels provide an enlarged width in the groove generally centrally between the bottom surface and the open top of the groove.

4. An apparatus as set forth in claim 3 wherein the grooves are tapered outwardly from the bottom surface to the open top.

5. An apparatus as set forth in claim 4 wherein the depth of the channels is in the range of about 1.5 mm thru about 3 mm.

6. An apparatus as set forth in claim 5 wherein the height of a channel is in the range of about 25% thru about 75% of the maximum height of a respective grove.

7. An apparatus as set forth in claim 6 further including at least one second carrier rod mounted on the frame and having a plurality of second grooves spaced apart along the length of the second carrier rod, said second grooves being spaced apart approximately the same distance as the spacing of the grooves in the first carrier rods and each being generally transversely aligned with a respective groove in each of the first carrier rods forming wafer receiving sockets, said second carrier rod being positioned between the first carrier rods and the frame bottom.

* * * * *